US006707346B2

(12) United States Patent
Tillotson et al.

(10) Patent No.: US 6,707,346 B2
(45) Date of Patent: Mar. 16, 2004

(54) APPARATUS AND METHOD FOR IMPROVED CRYSTAL TIME REFERENCE

(75) Inventors: Brian J. Tillotson, Kent, WA (US); Phillip R. Rotta, Kirkland, WA (US)

(73) Assignee: The Boeing Company, Chicago, IL (US)

( * ) Notice: Subject to any disclaimer, the term of this patent is extended or adjusted under 35 U.S.C. 154(b) by 55 days.

(21) Appl. No.: 10/027,599

(22) Filed: Dec. 19, 2001

(65) Prior Publication Data
US 2003/0112086 A1 Jun. 19, 2003

(51) Int. Cl.$^7$ ................................................ H03L 1/00
(52) U.S. Cl. ...................................... 331/175; 331/158
(58) Field of Search ............................. 331/175, 158, 331/74, 116 R; 340/466, 467; 324/727, 162

(56) References Cited

U.S. PATENT DOCUMENTS

| 3,662,269 | A | * | 5/1972 | Osborne et al. | ............... 455/71 |
| 4,100,512 | A | * | 7/1978 | Valdois et al. | ............... 331/158 |
| 4,318,063 | A | | 3/1982 | Przyjemski | ................. 331/158 |
| 4,453,141 | A | * | 6/1984 | Rosati | ........................ 331/158 |
| 4,588,969 | A | * | 5/1986 | Emmons | .................... 331/156 |
| 4,891,611 | A | * | 1/1990 | Frerking | ..................... 331/158 |
| 4,949,055 | A | | 8/1990 | Leitl | ........................... 331/158 |
| 5,777,525 | A | * | 7/1998 | Tanabe | ........................ 331/158 |
| 5,786,735 | A | | 7/1998 | Su | ............................... 331/158 |
| 5,875,388 | A | | 2/1999 | Daughtry, Jr. et al. | ..... 455/67.1 |
| 6,081,163 | A | | 6/2000 | Ujiie et al. | .................... 331/2 |
| 2003/0058057 | A1 | * | 3/2003 | Schmidt | ..................... 331/175 |

OTHER PUBLICATIONS

PCT International Search Report dated Apr. 10, 2003, PCT International Application No. PCT/US 02/39181 filed Dec. 9, 2002.

* cited by examiner

Primary Examiner—Robert Pascal
Assistant Examiner—Joseph Chang
(74) Attorney, Agent, or Firm—Harness Dickey & Pierce P.L.C.

(57) ABSTRACT

A timing reference system is provided for correcting inaccuracies in an output of a crystal oscillator experienced by the crystal oscillator during use in a mobile platform. The system utilizes a three-axis accelerometer mounted adjacent to the crystal oscillator on a substrate for sensing the acceleration experienced by the crystal oscillator. An offset generator converts the acceleration measurements generated by the accelerometer to error correction signals. These error correction signals represent the offset values needed to compensate for crystal timing drift due to the acceleration acting on the crystal oscillator thereby allowing the system to produce a corrected timing reference signal.

17 Claims, 3 Drawing Sheets

US 6,707,346 B2

APPARATUS AND METHOD FOR IMPROVED CRYSTAL TIME REFERENCE

FIELD OF THE INVENTION

The present invention relates generally to an electronic timing reference apparatus, and more particularly to a crystal timing apparatus and method that improves and maintains the timing accuracy of a digital reference timing signal for electronic and digital equipment.

BACKGROUND OF THE INVENTION

Modern military, aerospace and communications systems often require extremely stable and accurate timing devices. The most common timing reference in these electronic systems is a crystal oscillator. However, crystal oscillators are prone to slight changes in frequency. In fact, two major factors contribute to changes in the frequency of a crystal oscillator. The first is temperature and the second is acceleration. To avoid temperature-related drift, prior art precision timing references typically involve embedding a crystal oscillator in a temperature-controlled shell. Because it is easier to heat a device than to cool it, the shell is typically maintained at a temperature above the ambient temperature to thus maintain the crystal well above ambient temperature. Such a temperature-controlled crystal is often referred to as an "ovenized" crystal.

Often the principal contributor to acceleration is vibration of the circuit board on which the crystal is mounted. One prior art method for reducing this vibration is to mechanically isolate the ovenized crystal from its circuit board, typically by using flexible electrical connections (i.e. wires) as springs. However, this does not completely eliminate vibration. Furthermore, it does not reduce low-frequency or steady-state acceleration, such as the acceleration experienced while a vehicle is rapidly increasing in speed or performing a maneuver.

Timing drift due to low-frequency and steady-state acceleration will be particularly troubling in planned, high-bandwidth mobile military networks. The data rate for a single link in these networks can be 100 Mega bits per second (Mbps) or more. Direct links between nodes may be as long as 900 km. To attain such high data rates at long ranges, directional antennas, such as electronically steered phased array antennas, must be used. Phased array antennas have certain advantages, including the ability to hop the beam from target to target thousands of times per second. Hopping the beam permits many links to be established per antenna, but requires that each link use a multiplexing protocol, such as a Time Division Multiple Access (TDMA) protocol.

For the quality of service needed in these high bandwidth networks, the TDMA time slots must be accurately timed to within two or three microseconds, and this timing precision must be maintained when the Global Positioning Satellite (GPS) system is jammed for half an hour or more. This requires timing drift of less than 2 parts per billion. Timing stability at this level can be easily provided by atomic clocks, which are used by GPS systems, but atomic clocks are too big and too heavy to fit in most missiles, spacecraft, military aircraft or land vehicles. As a result, state-of-the-art ovenized crystal timing references will not meet the requirement of high-performance military TDMA networks.

Accordingly, there remains a need for a small, efficient solution to improve timing with a crystal oscillator as well as reduce the drift rate of ovenized crystal oscillators.

SUMMARY OF THE INVENTION

The foregoing drawbacks are overcome by an improved crystal time reference apparatus in accordance with the preferred embodiments of the present invention. The apparatus overcomes the aforementioned disadvantages as well as other disadvantages by reducing the drift rate of ovenized crystal oscillators.

The apparatus is utilized to produce a synchronized timing signal by mounting an accelerometer adjacent to a reference crystal for accurately sensing acceleration experienced by the reference crystal during use on a mobile platform. An offset generator in communication with the accelerometer converts the acceleration measurements generated by the accelerometer to error correction signals. These signals represent offset values needed to compensate for timing drift of the reference crystal output caused by the acceleration forces it experiences.

Upon receiving an output of the reference crystal and an output from the offset generator, the system determines a corrected timing reference signal. The present invention thus achieves a smaller and more precise timing device than previously developed time reference devices. Most importantly, the present invention is ideally suited for use on mobile platforms, such as commercial and military aircraft, where space is at a premium and the possibility of using other means to provide a more accurate timing reference, such as an atomic clock, is not a viable option.

BRIEF DESCRIPTION OF THE DRAWINGS

Additional advantages and features of the present invention will become apparent from the subsequent description and the appended claims, taken in conjunction with the accompanying drawings, wherein:

DETAILED DESCRIPTION OF THE PREFERRED EMBODIMENTS

Figure 1:
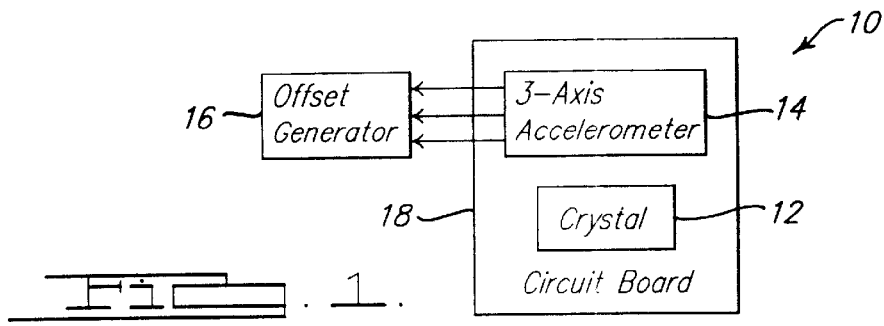
FIG. 1 is perspective diagram of a crystal time reference apparatus according to a preferred embodiment of the present invention.

With reference to FIG. 1 of the drawings, an improved crystal time reference apparatus 10 in accordance with a preferred embodiment of the present invention is shown. Apparatus 10 is shown to generally include a low frequency, precision crystal oscillator 12, a three-axis accelerometer 14 and an offset generator 16. The three-axis accelerometer 14 is mounted to a printed circuit board 18 adjacent to the crystal oscillator 12. The three-axis accelerometer 14 senses acceleration forces in the X, Y and Z axes experienced by the crystal oscillator 12 during use in a mobile platform, such as an aircraft, spacecraft, missile, ship or land vehicle, and generates signals representative of the sensed acceleration.

The offset generator 16 is in communication with the three-axis accelerometer 14 and converts the signals from the accelerometer 14 into error correction signals. These error correction signals represent the offset values needed to compensate for crystal timing drift due to the acceleration acting on the crystal oscillator 12. Upon receiving an output from the offset generator 16, the apparatus 10 determines the corrected time reference signal.

It will be understood by those skilled in the art that the components of FIG. 1 illustrates discrete components that can be purchased as off the shelf items from a variety of commercial sources.

Figure 2:
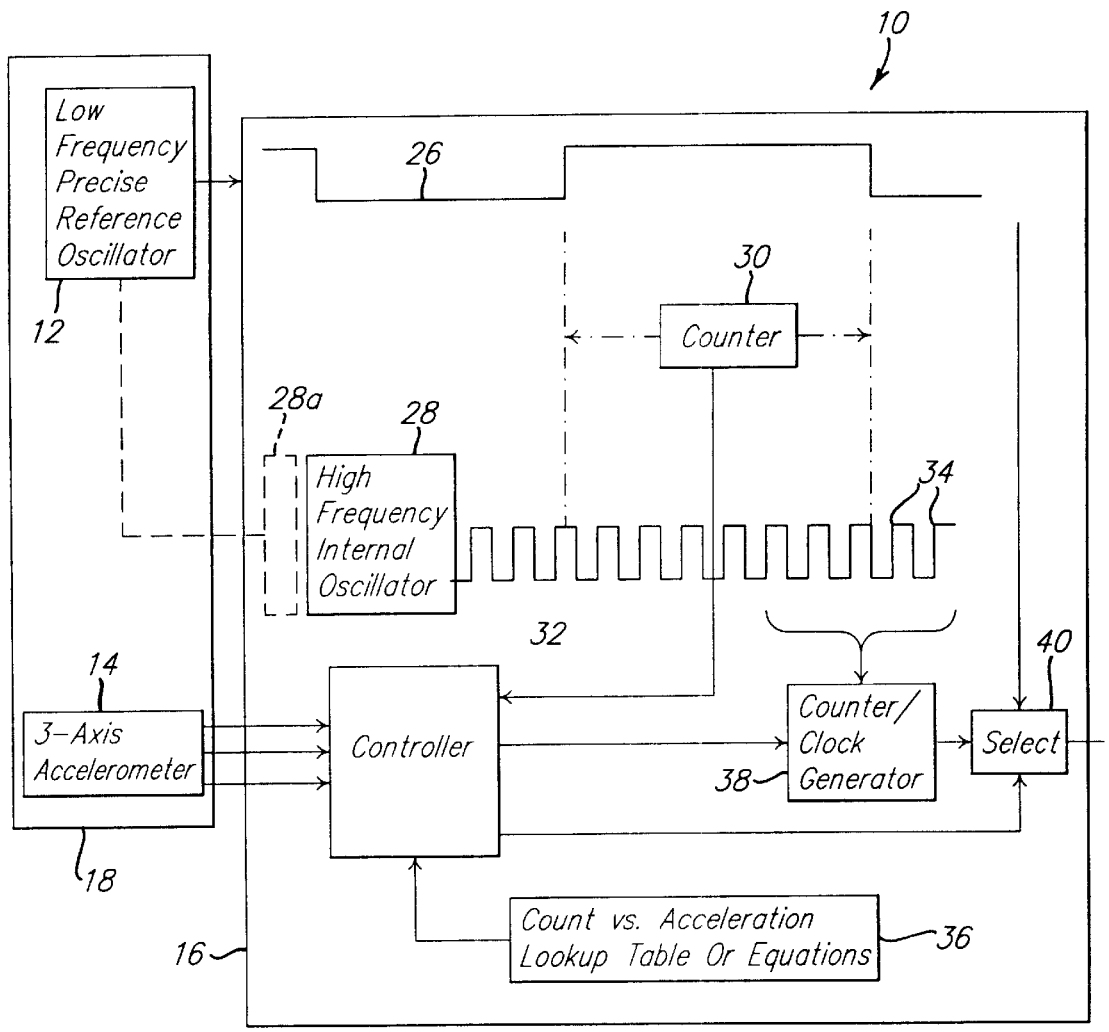
FIG. 2 is a detailed block diagram of one preferred form of an offset generator of the apparatus of the present invention.

With reference to FIG. 2 of the drawings, a detailed view of the offset generator 16 can also be seen. The high-precision reference crystal oscillator 12 produces a reference pulse train 26 at a relatively low frequency (e.g., 10 MHz). A high frequency internal oscillator 28, is provided to produce a high frequency pulse train (e.g., 2 GHz). A digital frequency multiplier 28a, shown in dashed lines, that uses crystal oscillator 12 as its source can be substituted for high frequency oscillator 28 to provide further simplification and higher accuracy. A counter 30 measures the number of high frequency pulses 34 per reference pulse and feeds this count to a controller 32. When the acceleration measured by the three-axis accelerometer 14 is near nominal (i.e., 1 gravity oriented in the vertical direction), the controller 32 records the count in a memory thereof and passes the output 26 of the reference oscillator 12, via a select switch 40 controlled by controller 32, to an output port 50 of the switch.

When the acceleration measured by the three-axis accelerometer 14 is substantially different from nominal, the controller 32 uses the value read from the accelerometer to obtain a corresponding correction value from a lookup table 36 (or equations) of count versus acceleration. The controller 32 applies this correction value to the counter/clock generator 38 to cause the counter/clock generator 38 to produce a pulse train having a frequency corresponding to that which would be produced by the reference crystal oscillator 12 at nominal acceleration. The number of internal pulses used to establish a reference clock pulse by the counter/clock generator 38 is adjusted continually in real time while the sensed acceleration remains non-nominal. During this time the select switch 40 is set to output the pulse train from the counter/clock generator 38 to output 50 of the switch.

When the sensed acceleration is no longer present, the controller 32 can cause the switch 40 to pass the output of the reference oscillator 12 directly to the output 50 of the switch. In this embodiment, the reference crystal oscillator 12 provides a highly accurate frequency reference while the apparatus 10 is at or near nominal acceleration. The internal oscillator 28 has lower intrinsic accuracy, but is used only during periods of high acceleration when the correction provided by the lookup table 36 is needed. Using a digital frequency multiplier in place of internal oscillator 28 that uses crystal oscillator 12 as its source will guaranty a high degree of accuracy at all times making the select function truly optional. For an application in which the apparatus 10 spends the great majority of time at or near nominal acceleration but with occasional large accelerations, this embodiment provides better overall accuracy than the reference crystal oscillator 12 alone could provide.

Figure 3:
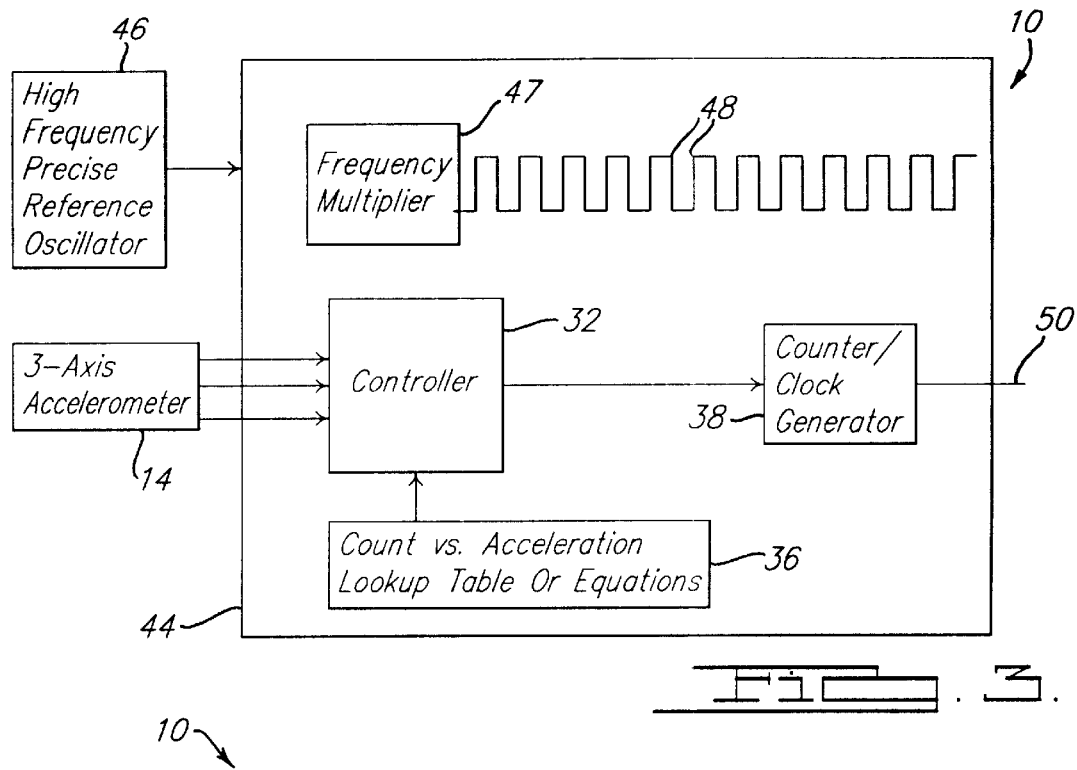
FIG. 3 is a detailed block diagram of an alternative preferred form of an offset generator of the present invention.

With reference to FIG. 3 of the drawings, a detailed view of an alternative offset generator 44 of the apparatus 10 is shown. A high-precision, high frequency reference oscillator 46 produces a reference pulse train 48 at relatively high frequency (e.g., 2 GHz). When the acceleration measured by the three-axis accelerometer 14 is substantially different from nominal, the controller 32 uses the acceleration value to obtain a correction value representing a number of pulses from the lookup table 36 (or equations) of count vs. acceleration. The lookup table returns the number of internal oscillator pulses at the current acceleration that equal the duration of one pulse of the reference oscillator 46 when it is at nominal acceleration. The controller 32 loads that number into the counter/clock generator 38 and enables the counter/clock generator 38 to produce a pulse train having a highly precise, stable, desired frequency. The number of internal reference pulses per output pulse is adjusted continually in real time while the acceleration remains non-nominal. When the sensed acceleration returns to normal, the controller 32 sends the appropriate count value to the counter/clock generator 38 for this condition. The inclusion of a digital frequency multiplier 47 to multiply the input frequency from reference oscillator 46 enables the selection of a lower frequency more readily available oscillator and it improves technical implementation by limiting routing of high frequency signals to within the digital offset generator 44.

For a given high frequency precise reference oscillator, the apparatus 10 can produce a range of precise output frequencies. As an option, the actual output frequency could be user programmable. For an application in which the apparatus 10 is expected to spend the great majority of time at or near nominal acceleration, but with occasional large accelerations, the embodiment of FIG. 3 provides even better overall accuracy than the crystal reference oscillator 46 alone could provide.

Figure 4:
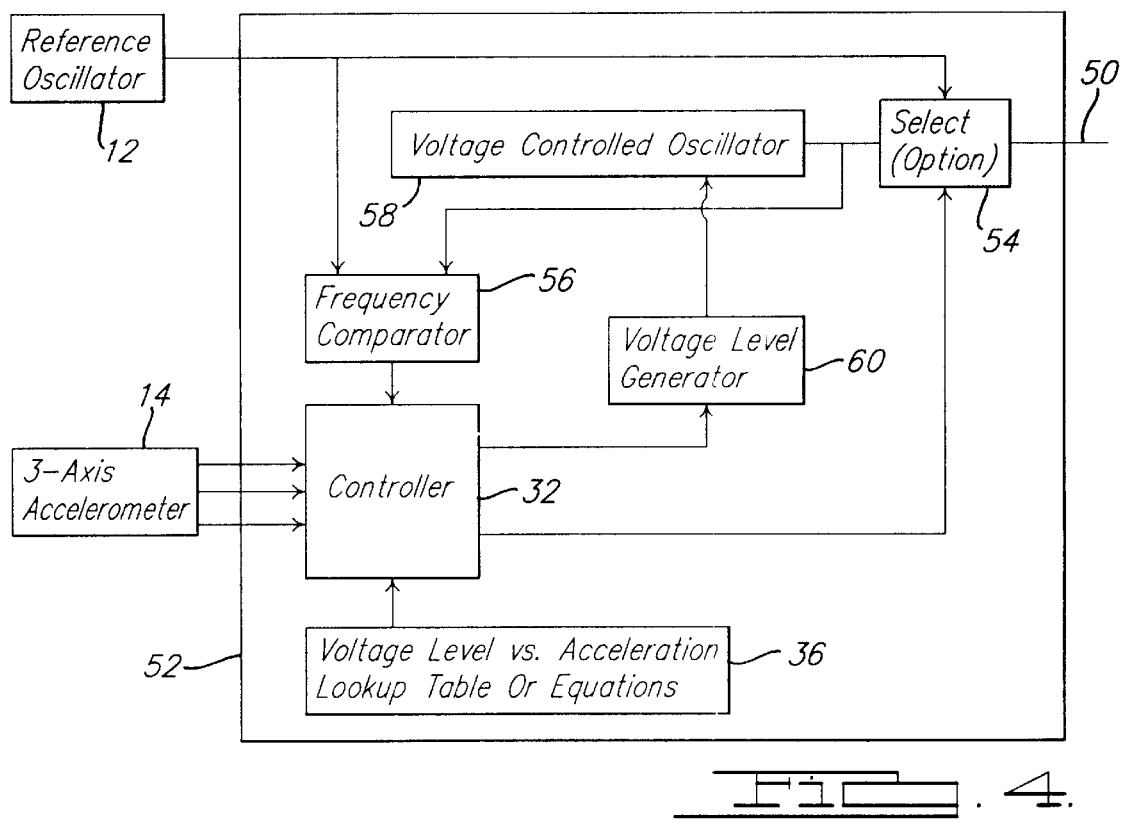
FIG. 4 is a detailed block diagram of another preferred form of an analog offset generator of the present invention.

With reference to FIG. 4 of the drawings, a block diagram of yet another preferred form of analog offset generator 52 of the apparatus 10 is shown. The reference crystal oscillator 12 produces a reference pulse train. A frequency comparator 56 compares the frequency of the reference pulse train to the output pulse train of a voltage controlled oscillator 58. The frequency difference is fed to the controller 32. When the acceleration measured by the three-axis accelerometer 14 is near nominal (i.e., 1 gravity oriented in the vertical direction), the controller 32 continually adjusts a voltage level generator 60 to provide a voltage output to the voltage controlled oscillator 58 that causes the oscillator 58 to produce a pulse train having a frequency identical to that of the reference crystal oscillator's 12 pulse train. The output of the voltage controlled oscillator 58 forms a precision timing reference signal.

When the acceleration measured by the three-axis accelerometer 14 is substantially different from nominal, the controller 32 commands the voltage level generator 60 to continue to produce the same output as that generated during the most recent nominal conditions. Depending on the voltage controlled oscillator implementation, optional count vs. acceleration look-up table or equations 36 may be used to compensate for any characteristic voltage controlled oscillator 58 variation resulting from acceleration. The count vs. acceleration look-up table or equations 36 may not be necessary for voltage controlled oscillator 58 implementations not susceptible to acceleration.

When the sensed acceleration returns to nominal, the controller 32 adjusts the voltage level generator 60 to cause the voltage controlled oscillator 58 to match the output frequency thereof with that of the reference oscillator 12. As an alternative, the analog offset generator 52 can pass the output of the reference crystal oscillator 12 via a select switch 54 directly to an output terminal of the switch. For an application in which the apparatus 10 spends the great majority of time at or near nominal acceleration, but with occasional large accelerations, this embodiment provides even better overall accuracy than the reference oscillator alone could provide.

Figure 5:
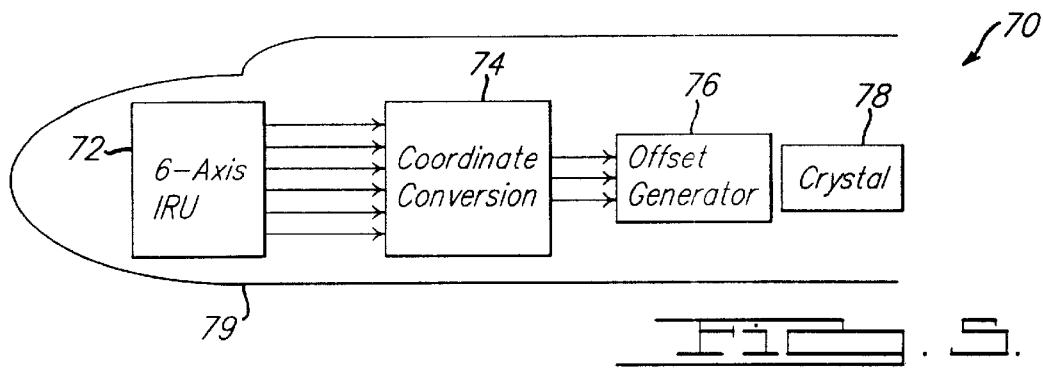
FIG. 5 is diagram of another alternative, preferred embodiment of the present invention shown incorporated on an aircraft and using the aircraft's IRU.

With reference to FIG. 5 of the drawings, an apparatus 70 in accordance with an alternative preferred embodiment of the present invention is shown. Apparatus 70 is shown on board a mobile platform 79, in this example an aircraft, and generally includes a six-axis inertial reference unit (IRU) 72, a coordinate conversion device 74, an offset generator 76 and a crystal oscillator 78. This embodiment exploits the presence of the IRU 72 carried by the mobile platform 79 and mounted at or near the flight deck of the aircraft 79 at a distance from the crystal oscillator 78. Acceleration and rotation sensed by the IRU 72 are input to a subsystem (not shown) which uses the location relative to the IRU to compute the acceleration vector of the crystal oscillator 78. This acceleration data is fed to the coordinate conversion device 74 that outputs signals to the offset generator 76 that are indicative of the sensed acceleration vector. The offset generator 76 then uses this information to access an internal lookup table to determine the required frequency offset correction value. The frequency offset correction value, again, is that value needed to compensate for crystal timing drift due to the acceleration experienced.

Those skilled in the art will appreciate that this embodiment is especially well suited to those applications where the crystal is very well isolated from local high-frequency vibration that can not be measured by the remote IRU 72.

Figure 6:
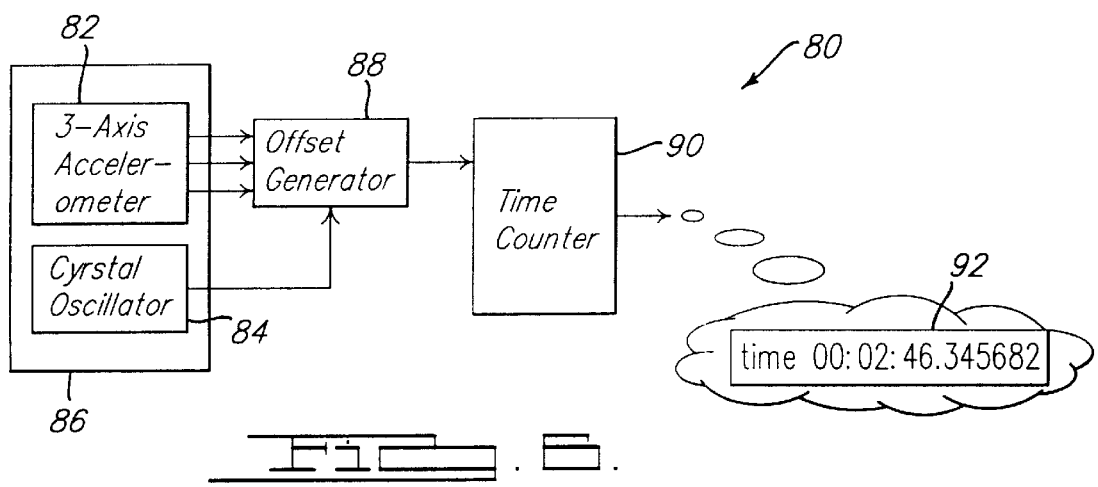
FIG. 6 is a block diagram of another alternative preferred embodiment of the present invention for producing a time counter.

With reference now to FIG. 6, a block diagram of an alternative preferred embodiment of a crystal timer correction apparatus 80 is shown. The apparatus 80 is used to determine, with high precision, the hours, minutes, seconds and fractions of seconds between two computer driven events occurring in a high acceleration environment such as might be experienced in a space craft, missile or high performance aircraft.

The apparatus 80 includes a three-axis accelerometer 82, a crystal oscillator 84, an offset generator 88 and a time counter 90. As with the apparatus 10, the three-axis accelerometer 82 is mounted to a printed circuit board 86 adjacent to a crystal oscillator 84. The three-axis accelerometer 82 senses the acceleration experienced by the crystal 84 and communicates this information to the offset generator 88. The offset generator 88 utilizes a lookup table and suitable equations to generate a precise output frequency which is applied to time counter 90. The time counter 90 counts the pulses of the frequency compensated (i.e., corrected) pulse train output by the offset generator 88 to maintain a highly accurate time clock. The clock information can then be provided to a computing device, control system or other system function/device requiring this precise time information.

Figure 7:
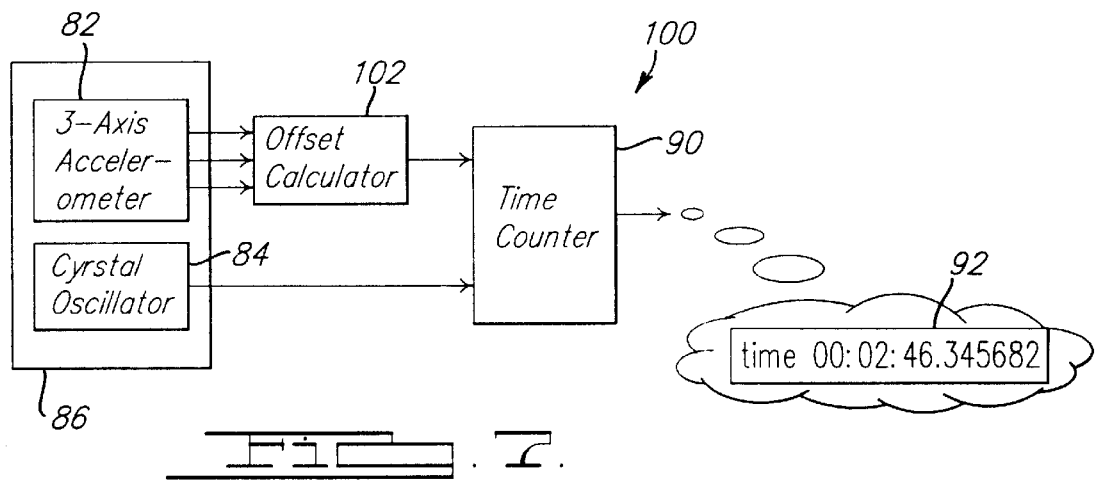
FIG. 7 is a block diagram of an alternative embodiment of the system of FIG. 6.

With reference to FIG. 7 of the drawings, a block diagram of an alternate preferred embodiment 100 of a crystal timer correction apparatus is shown. In this embodiment the correction timer apparatus 100 is identical to the embodiment 80 of FIG. 6 except that the time counter 90 accepts data from an offset calculator 102 and the crystal oscillator 84 to produce the corrected time output 92.

The offset calculator 102 information is used by the time counter 90 to adjust the running time value as required to compensate for the effect of acceleration on the crystal oscillator 84. The offset calculator 102 uses a lookup table and suitable equations that translate the measured acceleration into offset information to be used by the time counter 90. The time counter 90 corrects its time count based on the inputs from the offset calculator 102. The corrected time output from time counter 90 can then be provided to a computing device, control system or other system function/device requiring this precise time.

In accordance with the present invention, an apparatus and method of improving and maintaining the accuracy of a crystal reference oscillator in a mobile platform is provided. The apparatus of the present invention advantageously corrects for crystal oscillator time drift caused by low-frequency and steady-state acceleration, thus producing a stable, highly precise output frequency required for improved on-board electronic timing devices.

In addition, many modifications may be made to the present invention without departing from the essential scope thereof. Therefore, it is intended that the invention not be limited to the particular embodiments illustrated by the drawings and described in the specification as the best mode presently contemplated for carrying out this invention, but that the invention will include any embodiments falling within the foregoing description and the appended claims.

What is claimed is:

1. A timing apparatus for correcting for inaccuracy in an output of a crystal reference oscillator caused by acceleration experienced by the crystal reference oscillator, the apparatus comprising:

a substrate;

an accelerometer mounted adjacent to said crystal oscillator on said substrate for sensing acceleration experienced by said crystal during use of a mobile platform carrying said crystal; and an offset generator in communication with said accelerometer, the offset generator adapted to utilize a lookup table for converting acceleration measurements generated by said accelerometer to error correction signals that represent offset values needed to compensate for timing drift of said crystal reference oscillator caused by said acceleration and generating a corrected timing reference signal.

2. The timing apparatus of claim 1, wherein said crystal reference oscillator comprises an ovenized crystal oscillator.

3. The timing apparatus of claim 1, wherein said offset generator comprises a controller responsive to an output of said accelerometer.

4. The timing apparatus of claim 3, wherein said offset generator further comprises a high frequency internal oscillator for generating a high frequency pulse train for comparison to said output of said crystal reference oscillator.

5. The timing apparatus of claim 3, wherein said offset generator comprises a digital frequency multiplier using said output of said crystal reference oscillator for producing a high frequency output of said crystal reference oscillator.

6. The timing apparatus of claim 4, wherein said offset generator further comprises a counter for counting pulses produced by said high frequency internal oscillator and providing an output in accordance therewith to said controller.

7. The timing apparatus of claim 1, wherein said offset generator comprises:

a high frequency oscillator for generating a high frequency pulse train;

a counter for counting pulses of said high frequency oscillator;

a controller responsive to said accelerometer and said counter for determining said error correction signals; and a counter/clock generator responsive to said controller for generating said corrected timing reference signal.

8. The timing apparatus of claim 1, wherein said accelerometer comprises a thee-axis accelerometer.

9. The timing apparatus of claim 7, wherein said three-axis accelerometer continuously produces acceleration measurements.

10. An apparatus for use with a crystal reference oscillator for correcting for drift of an output of said oscillator caused by acceleration experienced by said oscillator, said apparatus comprising:

an accelerometer mounted adjacent said reference oscillator for sensing acceleration experienced by said reference oscillator; and an offset generator responsive to an output of said accelerometer, said offset generator including:
  a high frequency oscillator;
  a counter for counting pulses output by said high frequency oscillator;
  a controller responsive to said counter for comparing an output of said counter with an output of said reference oscillator and determining a needed correction value to compensate for error in said output of said reference oscillator caused by said acceleration; and
  a clock generator circuit responsive to said controller for applying said correction value to produce an output pulse train therefrom which is not influenced by said acceleration.

11. The apparatus of claim 10, wherein said offset generator comprises a digital type generator.

12. The apparatus of claim 11, wherein said offset generator comprises an analog type generator.

13. The apparatus of claim 10, wherein said controller includes a lookup table for containing a plurality of predetermined correction values dependent upon a corresponding plurality of sensed accelerations.

14. An apparatus for use with a crystal reference oscillator for correcting for drift of an output of said crystal reference oscillator caused by acceleration experienced by said oscillator, said apparatus comprising:

an accelerometer mounted adjacent said crystal reference oscillator for sensing acceleration experienced by said crystal reference oscillator;

an offset generator responsive to an output of said accelerometer, said offset generator including:
  a controller responsive to said accelerometer to determining a needed correction factor to compensate for error in said output of said crystal reference oscillator; and
  a counter/clock generator responsive to an output of said controller for generating a corrected timing reference signal which is free from an influence of said acceleration experienced by said crystal reference oscillator.

15. The apparatus of claim 14, wherein said controller comprises a lookup table for holding a plurality of correction factors corresponding to a plurality of corresponding accelerations sensed by said accelerometer.

16. A method for producing a reference timing signal which is adapted to be implemented on a mobile platform and is not susceptible to drift caused by acceleration forces experienced during movement of said mobile platform, said method comprising:

providing a reference crystal oscillator;

mounting an accelerometer adjacent said reference crystal oscillator;

using said accelerometer to sense acceleration forces caused by movement of said mobile platform;

supplying an output of said accelerometer to an offset generator which determines from said output appropriate offset correction information to negate the influence of said acceleration forces on an output of said reference crystal oscillator, wherein said offset correction information is obtained from a pre-determined lookup table or equations that translate the sensed acceleration; and generating an output from said offset generator which represents a corrected reference timing signal free from the influence of said acceleration forces.

17. The method of claim 16, wherein the step of generating an output from said offset generator which represents a corrected reference timing signal free from the influence of said acceleration forces forms a precision timing reference signal.

* * * * *